US005970022A

United States Patent [19]

Hoang

[11] Patent Number: 5,970,022

[45] Date of Patent: Oct. 19, 1999

[54] SEMICONDUCTOR MEMORY DEVICE WITH REDUCED READ DISTURBANCE

[75] Inventor: Loc B. Hoang, San Jose, Calif.

[73] Assignee: Winbond Electronics Corporation, China

[21] Appl. No.: 08/822,127

[22] Filed: Mar. 21, 1997

[51] Int. Cl.[6] .................................................... G11C 11/00

[52] U.S. Cl. ................. 365/233.5; 365/233; 365/230.01; 365/230.06

[58] Field of Search .............................. 365/230.01, 233, 365/233.5

[56] References Cited

U.S. PATENT DOCUMENTS

| | | | |
|---|---|---|---|
| 5,072,131 | 12/1991 | Nakano | 307/231 |
| 5,438,548 | 8/1995 | Houston | 365/227 |
| 5,493,537 | 2/1996 | McClure | 365/233.5 |
| 5,537,362 | 7/1996 | Gill et al. | 365/233.5 |
| 5,592,426 | 1/1997 | Fallki et al. | 365/203 |
| 5,592,435 | 1/1997 | Mills et al. | 365/233.5 |
| 5,617,350 | 4/1997 | Rodrparvai | 365/185.02 |
| 5,640,363 | 6/1997 | Furutani et al. | 365/233.5 |
| 5,648,934 | 7/1997 | O'Toole | 365/200 |
| 5,694,369 | 12/1997 | Abe | 365/210 |
| 5,694,370 | 12/1997 | Yoon | 365/233.5 |
| 5,696,730 | 12/1997 | Slezak et al. | 365/227 |
| 5,715,208 | 2/1998 | Casper et al. | 365/230.08 |
| 5,719,812 | 2/1998 | Seki et al. | 365/194 |
| 5,719,820 | 2/1998 | Fuji | 365/233.5 |

*Primary Examiner*—Viet Q. Nguyen
*Attorney, Agent, or Firm*—Proskauer Rose LLP

[57] ABSTRACT

An apparatus and method for use in a semiconductor memory device to reduce or eliminate read disturbance effects. Select signals supplied from one or more address decoders to a memory array are used to select particular wordlines and bitlines of the array. Read disturbance effects can arise when select signal voltage stresses are applied for extended periods of time to terminals of memory cells coupled to the selected wordlines and bitlines. The memory device therefore includes circuitry to detect a transition in at least one of the select signals, and to generate a timing signal from the detected transition. The timing signal is supplied to the address decoders and directs the decoders to deselect previously-selected wordlines and bitlines at a predetermined time after the transition. The predetermined time is chosen to be greater than or equal to the total time required to read data reliably from the selected memory cells before the deselection of the wordlines and bitlines. The deselection ensures that voltage stresses will not be applied to selected memory cells for extended periods of time, and the contents of the cells are therefore not unintentionally altered due to read disturbance effects.

16 Claims, 5 Drawing Sheets

200 218 X PRE-DECODER 220 WORD-LINE DECODER 212 MEMORY ARRAY BL(K) 214 WL(j) SL(j) 216 ADDRESS INPUT BUFFER A(0:N) N P(t) 232 TIMING P(t) 222 Y PRE-DECODER 224 BITLINE DECODER 214 DETECTOR SENREF 8 DL(0:7) SA X8 226 CE OE WE CONTROL LOGIC 230 8 OE OUTPUT BUFFER 228 8 DQ(0:7)

10
12
MEMORY ARRAY
BL(K)
14
WL(j)
SL(j)
20
WORD-LINE DECODER
18
X PRE-DECODER
ADDRESS INPUT BUFFER
A(0:N)
N
16
22
Y PRE-DECODER
24
BITLINE DECODER
8
DL(0:7)
SENREF
SA X8
26
CONTROL LOGIC
30
CE
OE
WE
8
OE
OUTPUT BUFFER
28
8
DQ(0:7)

"A"
"B"
"C"
$\overline{CE}$
ADDR(O:N)
WL
BL
DATA OUT D(X,Y)
X,Y = m,n
X,Y = j,k
ALL WL's AND BL's DESELECTED
ALL WL's AND BL's ARE DESELECTED
WL(m)
WL(j)
BL(n)
BL(k)
D(m,n)
D(j,k)
$t_1$
$t_2$
$t_1$
$t_2$ 200
220
212
218
X
PRE-
DECODER
WORD-
LINE
DECODER
BL(K)
MEMORY
ARRAY
214
WL(j)
SL(j)
216
A(0:N)
N
ADDRESS
INPUT
BUFFER
222
224
232
P(t)
TIMING
P(t)
Y
PRE-DECODER
BITLINE DECODER
8
SENREF
DL(0:7)
214
DETECTOR
SA
X8
226
CE
OE
WE
CONTROL
LOGIC
230
8
OE
OUTPUT
BUFFER
228
8
DQ(0:7)

SEMICONDUCTOR MEMORY DEVICE WITH REDUCED READ DISTURBANCE

FIELD OF THE INVENTION

The present invention relates generally to semiconductor memory devices and more particularly to a semiconductor memory device in which long-term read disturbance effects resulting in unintentional alteration in memory cell contents over time are substantially eliminated.

BACKGROUND OF THE INVENTION

FIG. 1 shows a portion of a conventional floating gate memory device 10. Floating gate memory devices such as device 10 may be programmed using hot electron injection and erased using Fowler-Nordheim tunneling as is well-known and described in detail in U.S. Pat. Nos. 5,029,130 and 5,289,411. The device 10 includes a memory array 12 of floating gate memory cells 14. The memory array 12 includes a plurality of wordlines WL(j), j=1, 2, . . . J and a plurality of bitlines BL(k), k=1, 2, . . . K. A floating gate memory cell 14 located at the intersection of each WL(j) and bitline BL(k) is used to store a single bit of data. The device 10 includes an address input buffer 16 which receives an N-bit input address ADDR(0:N) designating a particular wordline WL(j) of cells 14 in the array 12. The address buffer 16 supplies portions of the input address ADDR(0:N) to an X or row pre-decoder 18. The X pre-decoder 18 supplies partially-decoded wordline address signals to a worldwide decoder 20 which selects the particular wordline WL(j) corresponding to the input address ADDR(0:N). The address buffer 16 also supplies a portion of the input address to a Y or column pre-decoder 22, which in turn supplies partially-decoded bitline address signals to a bitline decoder 24.

The device 10 in this example is configured as an 8-bit device and bitline decoder 24 therefore selects eight bitlines BL(k) corresponding to a group of eight memory cells 12 on the selected wordline WL(j), and supplies the data programmed in the selected cells to one input of a multiple sensing amplifier 26 via data lines DL(0:7). The multiple sensing amplifier 26 includes eight sensing amplifiers, each of which compare the data signal on one of the lines DL(0:7) to a reference SENREF. The multiple sensing amplifier 26 thus senses and amplifies the retrieved data on data lines DL(0:7) and supplies the resulting signals to an output buffer 28. The output buffer 28 supplies the retrieved data to output pins DQ(0:7) when enabled by an output enable (OE) signal supplied by a control logic circuit 30. The control logic circuit 30 receives complements of the OE signal, a chip enable (CE) signal and a write enable (WE) signal, and controls the operation of address input buffer 16 as well as other elements of the device 10. The device 10 may be configured as a 16-bit device, 32-bit device and so on by suitable alteration of the number of bitlines in a particular selected group of bitlines BL(k), the number of sensing amplifiers in multiple sensing amplifier 26, and the number of lines DL, DQ and the like.

Data may be programmed into the cells 14 of a selected word line WL(j) of array 12 in the following manner. The wordline decoder 20 supplies a threshold potential typically less than +5 volts to the selected wordline WL(j) and thereby to the gates of the cells 14 coupled to that wordline. A voltage of approximately +12 volts is supplied from a high voltage (HV) decoder (not shown) to the source of each of the cells 14 in the selected wordline via a corresponding N+ source line SL(j). A given cell 14 in the selected wordline is then programmed to a particular logic value by bringing the corresponding bitline BL(k) and thereby the drain of the given cell 14 to either 0 volts or +5 volts depending on the logic value to be programmed. Hot electrons from the source of the given cell 14 can thereby be injected into and stored on the floating gate of the cell.

Data may be read back from the cells 14 of a selected wordline WL(j) by bringing the sources of the cells to ground potential via source line SL(j), the drains of the cells to a read voltage on the order of +2 volts via corresponding bitlines BL(k), and the gates of the cells to about +5 volts via wordline WL(j). This will generate for each cell a signal indicative of the stored charge in that cell. These signals are amplified by sense amplifier 26 and supplied to output buffer 28 in the manner previously described.

Data may be erased from the cells 14 of a selected wordline WL(j) by bringing the source of the cells to ground potential via source line SL(j), the drains of the cells to ground potential via corresponding bitlines BL(k), and the gates of the cells to a potential of about +15 volts via the wordline WL(j). The high voltage potential on the gate of the floating gate cells 14 causes the charge stored on the floating gate to be removed by the mechanism of Fowler-Nordheim tunneling.

The above-described programming and erasing operations generally involve applying relatively high DC voltages to the cells 12 for periods of time on the order of milliseconds or microseconds. However, the contents of the memory cells 14 may also be unintentionally altered if lower DC voltages are applied to the cells for much longer periods of time. For example, the above-described read operation involves applying a voltage on the order of +5 volts to the gates of the memory cells 14 in a selected wordline WL(j). If the memory device 10 is placed in an active read mode in which +5 volts is applied to the gates of the cells 14 but no wordline or bitline addresses change for a relatively long period of time, the cells 14 may gradually gain or lose charge such that the stored logic values may be unintentionally altered. This unintentional alteration of stored charge under DC stress over relatively long periods of time is referred to as "read disturbance."

FIG. 2 is a timing diagram illustrating the read disturbance problem in greater detail. Several of the signals shown in the device 10 of FIG. 1 are illustrated over three time periods A, B and C. During period A, the device 10 is inactive as indicated by the logic high level of the complemented CE signal applied to control logic circuit 30. The input address ADDR(0:N) is therefore ignored and the wordline (WL) signal and bitline (BL) signal are maintained at logic low levels such that all wordlines and bitlines are deselected.

During period B, the complemented CE signal goes low, and the device 10 is placed in an active read mode. The input address specifies a particular selected wordline WL(m) and a group of selected bitlines designated BL(n). In accordance with the above-described read operation, the selected wordline WL(m) is brought to a voltage of about +5 volts and the selected group of multiple bitlines BL(n) are brought to a read voltage on the order of +2 volts as shown in FIG. 2. The data from the cells designated by the intersection of wordline WL(m) and bitlines BL(n) is then read out in the manner previously described.

During period C, the complemented CE signal remains low and device 10 remains in an active read mode. The input address ADDR(0:N) in period C specifies a different wordline WL(j) and set of bitlines BL(k), such that the selected wordline WL(j) is brought to a voltage of about +5 volts and the selected bitlines BL(k) are brought to a read voltage on the order of +2 volts as shown. However, the active read mode of period C is a "DC idle" read mode in which the input address ADDR(0:N) does not change for an extended period of time. This places multiple cells on selected wordline WL(j) under a long-term DC stress on the order of +5 volts, places multiple cells on selected bitlines BL(k) under a long-term DC stress on the order of +2 volts, and places selected cells at the intersection of WL(j) and BL(k) under both +5 volt and +2 volt stresses.

As noted above, such long-term DC voltage stresses can result in the unintentional alteration of stored charge in the stressed cells, leading to the loss of programmed data and therefore device malfunction. Conventional memory devices such as device 10 of FIG. 1 provide no sufficiently effective mechanism for reducing or otherwise alleviating these read disturbance effects.

It is therefore an object of the present invention to provide an improved memory device in which read disturbance effects may be substantially eliminated without unduly increasing the die size or power consumption of the device.

SUMMARY OF THE INVENTION

The present invention provides an improved semiconductor memory device which detects the presence of long-term voltage stresses during read operations and subsequently deselects certain wordlines and/or bitlines to remove the stresses. The stress detection and removal prevent unintentional read disturbance-induced alteration of memory cell contents.

A preferred embodiment of the invention involves a method for reducing read disturbance in a semiconductor memory device. Select signals are supplied from one or more address decoders to a memory array and are used to select particular wordlines and bitlines of the array. The memory device includes circuitry to detect a transition in at least one of the select signals, and to generate a timing signal from the detected transition. The timing signal is supplied to the address decoders and directs the decoders to deselect previously-selected wordlines and/or bitlines at a predetermined time after the transition. The predetermined time is chosen to be greater than or equal to the total time required to read data reliably from the selected memory cells before the deselection of the wordlines and/or bitlines. The deselection ensures that voltage stresses will not be applied to selected memory cells for extended periods of time, and the contents of the cells are therefore not unintentionally altered due to read disturbance effects.

In accordance with another aspect of the invention, detection circuitry in the memory device may also detect a transition in a chip enable (CE) signal which serves to enable a read mode of operation. A timing circuit in the memory device then generates a timing signal in response to the transition in the CE signal. The timing signal is supplied to one or more address decoders and directs the decoders to deselect previously-selected wordlines and bitlines after expiration of a predetermined time period which ensures reliable reading of data from the selected memory cells.

In accordance with another aspect of the invention, the predetermined time is selected as the sum of first and second periods of time. The first period of time represents the time measured from the detected transition to a subsequent time at which valid data can be latched from the selected memory cells. This first period of time is generally greater than or equal to the sum of: (i) a time from the detected transition until wordlines and/or bitlines are selected, and (ii) a data sensing time for the selected memory cells. The second period of time is measured from the end of the first period of time to a time at which the previously-selected wordlines and/or bitlines may be deselected. This second period of time is generally greater than or equal to the sum of: (i) a data latch clock skew of the memory device, and (ii) a data latch hold time requirement of the memory device.

These and other advantages and features of the present invention will become more apparent from the accompanying drawings and the following detailed description of the invention.

DETAILED DESCRIPTION OF THE INVENTION

The present invention will be illustrated herein in conjunction with active read modes of an exemplary floating gate semiconductor memory device. It should be understood, however, that the present invention is not limited to use with any particular type of memory device or operating mode. The invention is instead more broadly applicable to any memory device in which it is desirable to reduce or eliminate read disturbance effects. Memory devices which may utilize the read disturbance reduction techniques of the present invention include, for example, Flash memory, EPROM, EEPROM, and Masked ROM. The term "voltage stress" should be understood to include any type of DC or AC voltage or other electrical signal which could induce unintentional alteration of the stored contents of a memory cell if applied to that cell for an extended time period.

Figure 1:
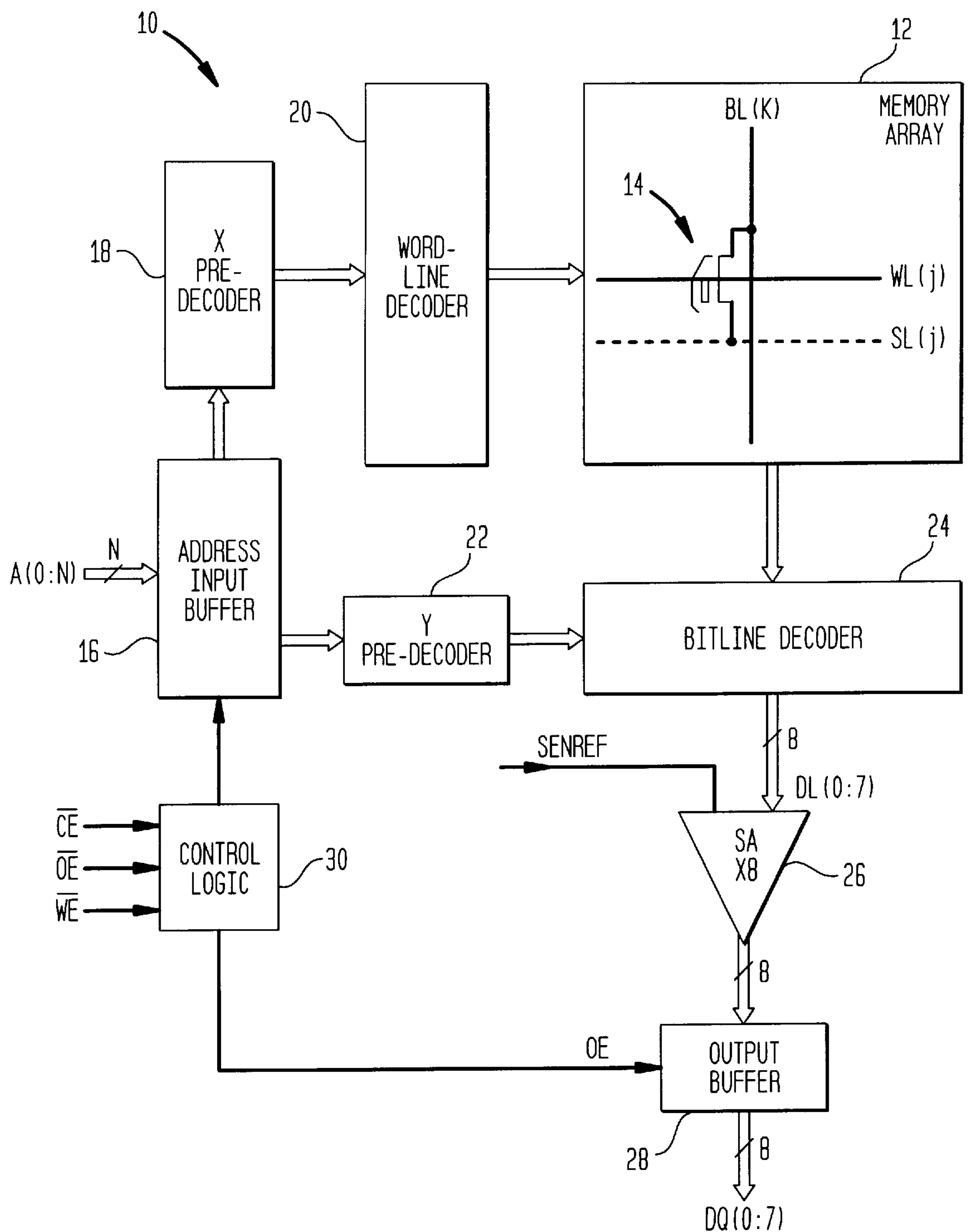
FIG. 1 shows a prior art floating gate memory device.
Figure 2:
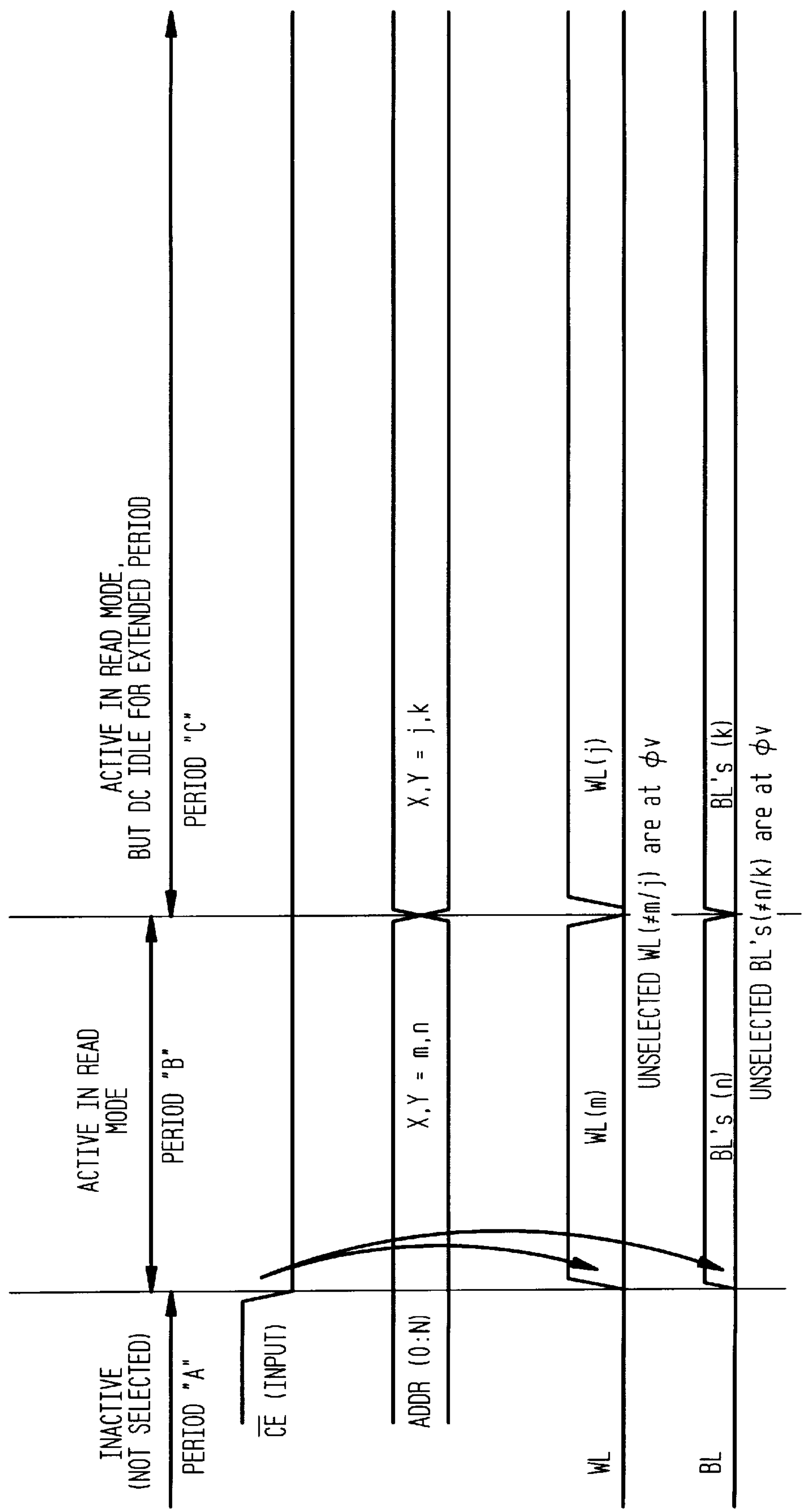
FIG. 2 is a timing diagram illustrating the operation of the prior art memory device of FIG. 1.
Figure 3:
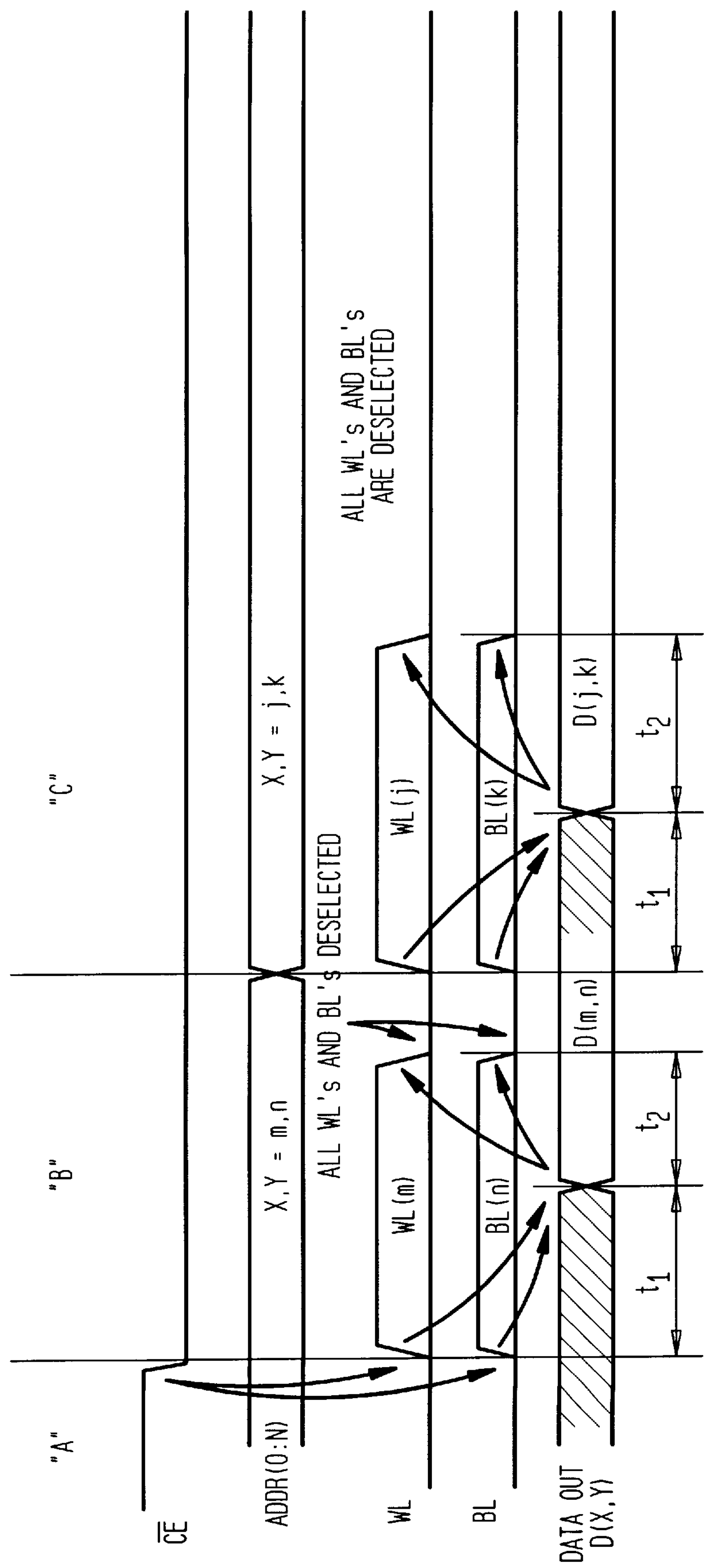
FIG. 3 is a timing diagram illustrating the operation of an exemplary memory device with reduced read disturbance in accordance with the invention.

FIG. 3 is a timing diagram illustrating the operation of an exemplary memory device in accordance with the present invention. The memory device may be configured substantially in the manner shown in FIG. 1 but with additional detection and timing circuitry to be described below. The timing diagram of FIG. 3 illustrates the chip enable CE, input address ADDR(0:N), wordline WL and bitline BL signals in a memory device in accordance with the invention. These signals are illustrated over the same three time periods A, B and C used in the prior art timing diagram shown in FIG. 2. The timing diagram of FIG. 3 also shows a latched data out signal D(x,y) corresponding to the output of the memory cells at the intersection of wordline WL(x) and bitlines BL(y). The signal D(x,y) may correspond to a latched output of a bitline decoder, a sensing amplifier or an output buffer.

During period A, the memory device of the present invention is inactive as indicated by the logic high level of the complemented CE signal. The input address ADDR(0:N) is therefore ignored and the WL signal and BL signal are maintained at logic low levels such that all wordlines and bitlines in the memory device are deselected.

During period B, the complemented CE signal goes low, and the memory device is placed in an active read mode. The input address ADDR(0:N) specifies a particular selected wordline WL(m) and a group of selected bitlines BL(n). As in the abovedescribed conventional read operation, the selected wordline WL(m) is brought to a voltage of about +5 volts and the group of selected bitlines BL(n) are brought to a read voltage on the order of +2 volts as shown in FIG. 3. In accordance with the invention, the data from the cells designated by the intersection of wordline WL(m) and bitlines BL(n) are latched in a bitline decoder, sensing amplifier or output buffer of the memory device after a time period $t_1$ to provide the D(x,y) signal shown in FIG. 3. The time period $t_1$ used in period B is measured from the falling edge of the complemented CE signal which triggers the start of period B. The D(x,y) signal includes latched data from the cells designated by WL(m) and BL(n) after the expiration of the time period $t_1$. This latched data may be passed through a bitline decoder, sensing amplifier and output buffer to the output pins DQ of the memory device. The value of $t_1$ in period B is selected as greater than or equal to the sum of: (i) the time from the falling edge of the complemented CE signal until the wordline WL(m) and the bitlines BL(n) have been selected; and (ii) the data sensing time for the selected memory cells.

The selected wordline WL(m) and selected bitlines BL(n) are then deselected in period B after expiration of second time period $t_2$. The time period $t_2$ is measured from the end of time period $t_1$ and is selected to be greater than or equal to the sum of: (i) the data out latch clock skew; and (ii) the data latch hold time requirement of the memory device. This automatic deselection process ensures that during any active read operation, the selected wordline and bitlines are only subject to DC voltage stresses for a minimum period of time required for reliably reading data from the selected cells.

During period C, the complemented CE signal remains low and the memory device remains in an active read mode. The input address ADDR(0:N) transitions from the previous address of period B to a new address specifying another wordline WL(j) and set of bitlines BL(k). The intersection of the wordline WL(j) and bitlines BL(k) specified by the new address identify a new set of memory cells to be read during period C. The selected wordline WL(j) is then brought to a voltage of about +5 volts and the selected bitlines BL(k) are brought to a read voltage on the order of +2 volts as in the conventional read operation.

The active read mode of period C is a "DC idle" read mode in which the input address ADDR(0:N) does not change for an extended period of time. As described above, this "DC idle" read mode in a conventional memory device places multiple cells on selected wordline WL(j) under a long-term DC stress on the order of +5 volts, places multiple cells on selected bitlines BL(k) under a long-term DC stress on the order of +2 volts, and places selected cells at the intersection of WL(j) and BL(k) under both +5 volt and +2 volt stresses. Such long-term DC voltage stresses can result in the unintentional alteration of stored charge in the stressed cells, leading to the loss of programmed data and therefore device malfunction. The present invention overcomes this problem by automatically deselecting a selected wordline arid bitlines after the data has been read from the corresponding cells.

The transition in the input address ADDR(0:N) triggers the start of period C and the selection of wordline WL(j) and bitlines BL(k). The time period $t_1$ in period C represents the time after the ADDR(0:N) transition at which the data read from the memory cells can be reliably latched. As in the case of period B, the D(x,y) signal includes latched data from the cells designated by WL(j) and BL(k) after the expiration of the time period $t_1$. This latched data may be passed through a bitline decoder, sensing amplifier and output buffer to the output pins DQ of the memory device. The value of $t_1$ in period C is selected as greater than or equal to the sum of: (i) the time from the ADDR(0:N) transition until the wordline WL(m) and the bitlines BL(n) have been selected; and (ii) the data sensing time for the selected memory cells.

The selected wordline WL(j) and selected bitlines BL(k) are then deselected in period C after expiration of second time period $t_2$. The time period $t_2$ is measured from the end of time period $t_1$ and as in the case of period B is selected to be greater than or equal to the sum of: (i) the data out latch clock skew; and (ii) the data latch hold time requirement of the memory device. The deselection effectively removes any DC voltage stresses which would have otherwise been applied to the selected wordline WL(j) and bitlines BL(k) during the "DC idle" read operation of period C. This essentially eliminates read disturbance effects and ensures that memory cell contents are not inadvertently altered during read operations.

Figure 4:
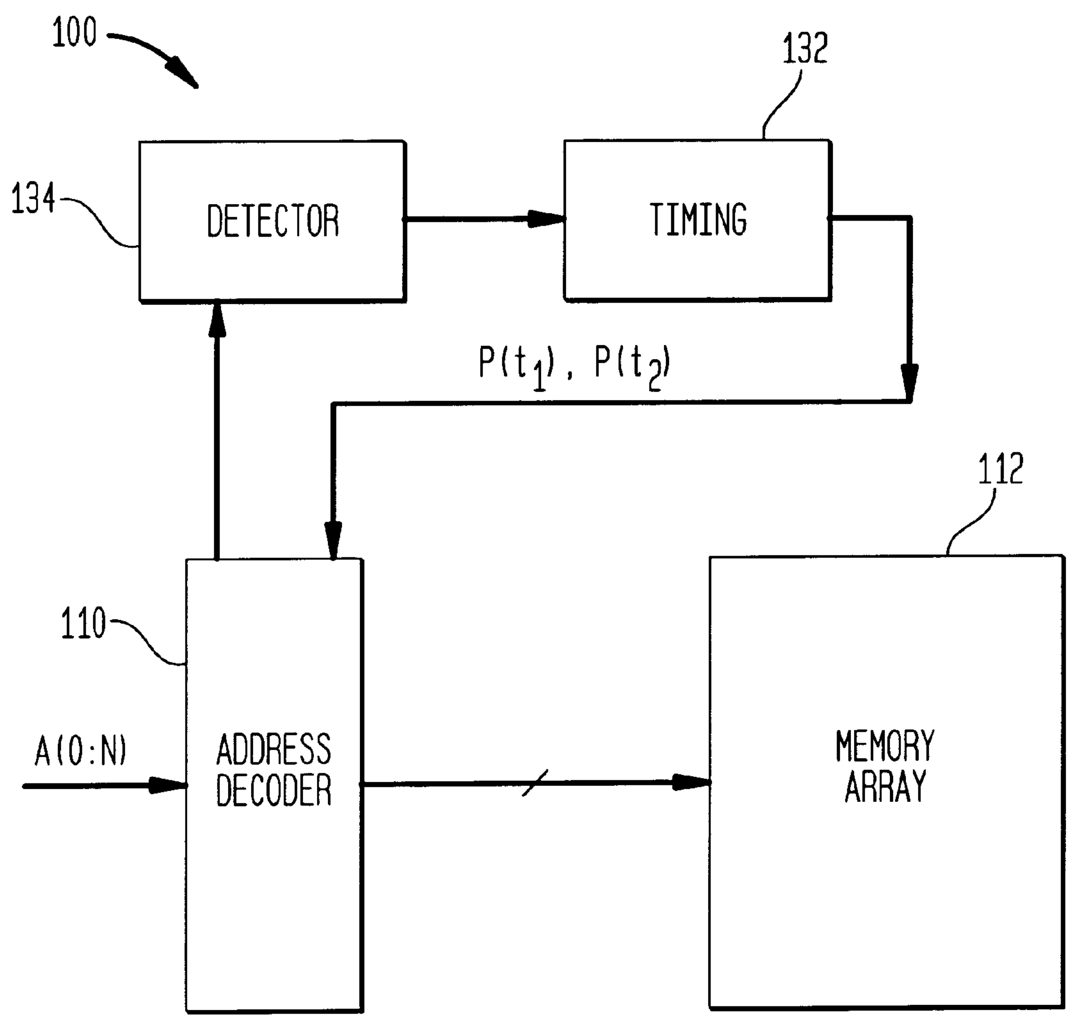
FIG. 4 is a block diagram of a semiconductor memory device with reduced read disturbance in accordance with an exemplary embodiment of the present invention.

FIG. 4 shows a block diagram of a portion of a memory device 100 in which the above-described wordline and bitline deselection operations may be implemented. The memory device 100 includes a conventional memory array 112 and other supporting circuitry as previously described in conjunction with FIG. 1. The memory device 100 also includes an address decoder 110 which may represent a wordline decoder or pre-decoder, a bitline decoder or pre-decoder, or any other suitable address generating circuit. The wordline and/or bitline outputs of the address decoder 110 are applied to a transition detector circuit 134 which detects transitions in the ADDR(0:N) signal such as those which occur between the read operations of periods B and C in FIG. 3. The detector circuit 134 also detects a transition in the complemented CE signal such as that which occurs between periods A and B in FIG. 3. The detector circuit 134 in response to the detected transitions triggers a timing circuit 132 which generates pulse signals $P(t_1)$ and $P(t_2)$ which define the previously-described time periods $t_1$ and $t_2$, respectively. For example, the timing circuit 132 may generate a pulse signal $P(t_1)$ having a pulse width of $t_1$ in response to detection of a CE or ADDR(0:N) transition in detector circuit 134. The timing circuit 132 then generates a pulse signal $P(t_2)$ having a pulse width of $t_2$ in response to the falling edge of the pulse signal $P(t_1)$. These pulse signals or other suitable timing signals are then applied to the address decoder 110 to trigger deselection of previously-selected wordlines and/or bitlines in the manner described above. It should be noted that the illustrated detection and timing elements may be implemented using any of a number of conventional circuits.

Figure 5:
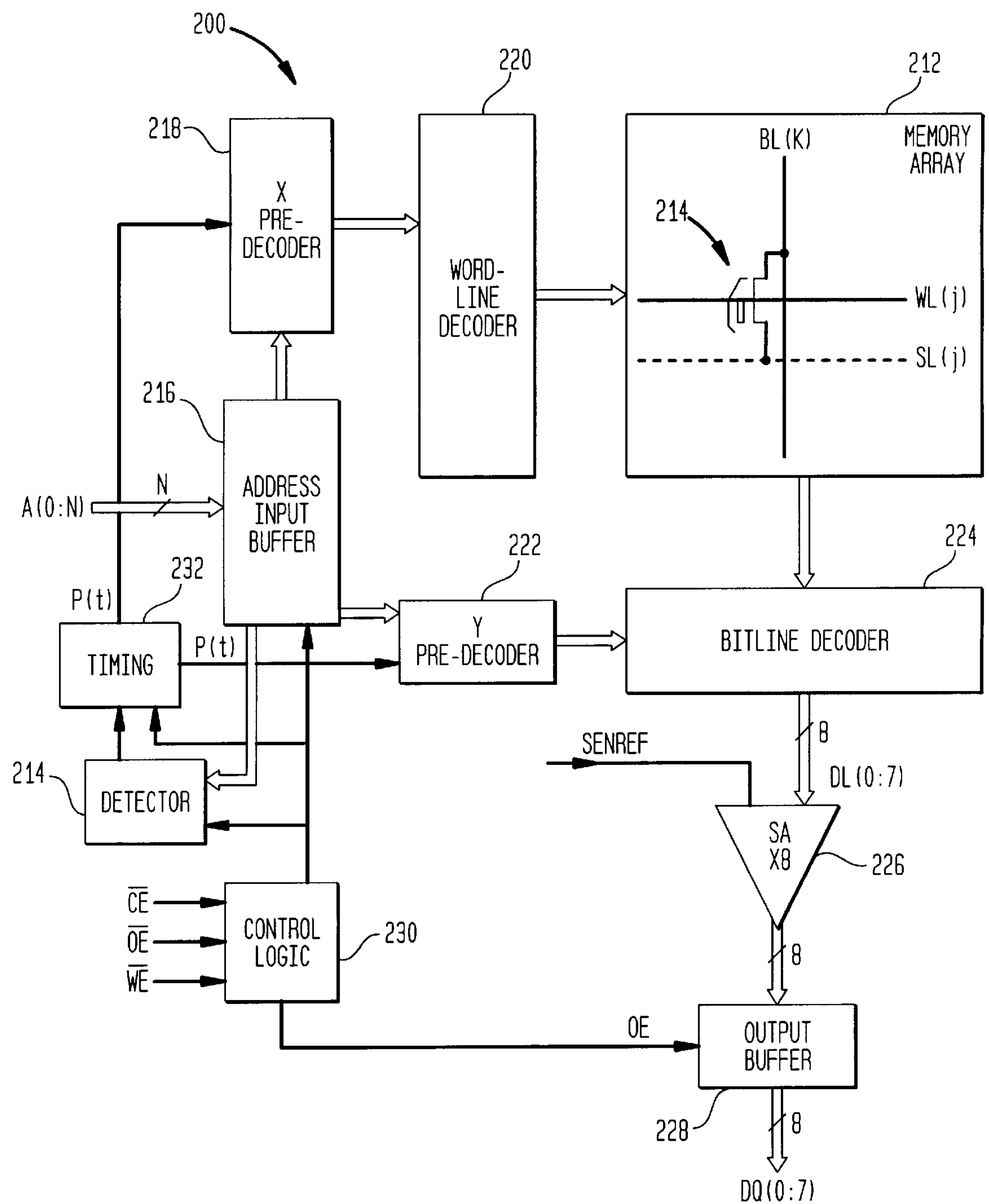
FIG. 5 is a block diagram of a floating gate memory device with reduced read disturbance in accordance with a second exemplary embodiment of the present invention.

For example, FIG. 5 shows a block diagram of a floating gate memory device 200 with reduced read disturbance which incorporates certain circuitry as previously described in conjunction with FIG. 5. Specifically, the detector 234 receives portions of the input address ADDR(0:N) from the address buffer 216 and the complemented CE signals from control logic 230. In response, detector 234 triggers timing circuit 232 to supply pulse signals p(t) (i.e., p(t1,t2)) to the appropriate X or Y pre-decoder 218 and 222, respectively, to trigger deselection of previously-selected wordlines and/or bitlines. The remaining circuitry of device 200 operates in substantially the same manner in device 10.

Alternative embodiments of the invention may utilize the described wordline and bitline deselection processes in operating modes other than active read modes. For example, various wordlines and/or bitlines subject to excessive voltage stresses in write or erase modes may be deselected after expiration of a minimal predetermined time period suitable for accomplishing the desired function.

The above-described embodiments of the invention are intended to be illustrative only. Numerous alternative embodiments within the scope of the appended claims will be apparent to those of ordinary skill in the art.

The invention claimed is:

1. An apparatus for use in a semiconductor memory device including a memory array with a plurality of wordlines and a plurality of bitlines, the apparatus comprising:

a decoder for supplying select signals to the memory array to select a particular wordline;

a detector for detecting the presence of a transition in at least one of the select signals; and a timing circuit having an input coupled to an output of the detector, the timing circuit supplying a first timing signal to the decoder indicating a first period of time following the transition after which data read from a selected wordline may be latched, wherein the first period of time is selected as greater than or equal to the sum of: (i) a time from the transition until a wordline is selected, and (ii) a data sensing time for memory cells of the selected wordline, and a second timing signal to the decoder indicating a second period of time following the first period of time after which the previously-selected particular wordline may be deselected at a predetermined time after said transition, wherein the predetermined time corresponds to the sum of the first and second time periods.

2. The apparatus of claim 1 wherein the second period of time is selected as greater than or equal to the sum of: (i) a data latch clock skew of the memory device, and (ii) a data latch hold time requirement of the memory device.

3. The apparatus of claim 1 wherein the detector detects the transition by processing an input address signal applied to the decoder to generate the select signals.

4. The apparatus of claim 1 wherein the detector has an input coupled to an output of the decoder and detects the transition by processing at least a subset of the select signals supplied by the decoder to the memory array.

5. The apparatus of claim 1 wherein the decoder supplies select signals to the memory array to select the particular wordlines and certain of the plurality of bitlines, and the timing circuit supplies a timing signal to the decoder which directs the decoder to deselect the previously-selected particular wordline and at least a subset of the previously-selected bitlines at a predetermined time after said transition.

6. The apparatus of claim 1 wherein the detector further detects a transition in an enable signal which enables said memory device.

7. The apparatus of claim 6 wherein the timing circuit supplies a timing signal to the decoder to direct the decoder to deselect the previously-selected particular wordline at a predetermined time after said transition in said enable signal.

8. A method for use in a semiconductor memory device including a memory array with a plurality of wordlines and a plurality of bitlines, the method comprising the steps of:

supplying select signals to the memory array to select a particular wordline;

detecting the presence of a transition in at least one of the select signals; and generating, in response to the transition, a first timing signal indicating a first period of time following the transition after which data read from a selected wordline may be latched, wherein the first period of time is selected as greater than or equal to the sum of: (i) a time from the transition until a wordline is selected, and (ii) a data sensing time for memory cells of the selected wordline, and a second timing signal indicating a second period of time following the first period of time after which the previously-selected particular wordline may be deselected at a predetermined time after the transition, wherein the predetermined time corresponds to the sum of the first and second time periods.

9. The method of claim 8 wherein the second period of time is selected as greater than or equal to the sum of: (i) a data latch clock skew of the memory device, and (ii) a data latch hold time requirement of the memory device.

10. The method of claim 8 wherein the step of detecting the presence of a transition further includes the step of detecting the transition by processing an input address signal applied to the decoder to generate the select signals.

11. The method of claim 8 wherein the step of detecting the presence of a transition further includes the step of detecting the transition by processing at least a subset of the select signals supplied to the memory array.

12. The method of claim 8 wherein the step of supplying select signals to the memory array further includes supplying select signals to the memory array to select the particular wordlines and certain of the plurality of bitlines, and wherein the step of generating a timing signal further includes generating a timing signal which directs the decoder to deselect the previously-selected particular wordline and at least a subset of the previously-selected bitlines at a predetermined time after said transition.

13. The method of claim 8 further including the step of detecting a transition in an enable signal which enables said memory device.

14. The method of claim 13 further including the step of generating in response to the transition in the enable signal a timing signal which directs the decoder to deselect the previously-selected particular wordline at a predetermined time after the transition in the enable signal.

15. A semiconductor memory device comprising:

a memory array with a plurality of wordlines and a plurality of bitlines;

a decoder for supplying select signals to the memory array to select a particular wordline;

a detector for detecting the presence of a transition in at least one of the select signals; and a timing circuit having an input coupled to an output of the detector, the timing circuit supplying a timing signal to the decoder which directs the decoder to deselect the previously-selected particular wordline at a predetermined time after said transition.

16. The memory device of claim 15 wherein the timing circuit supplies a first timing signal to the decoder indicating a first period of time following the transition after which data read from a selected wordline may be latched, and a second timing signal to the decoder indicating a second period of time following the first period of time after which the selected wordline may be deselected, wherein the predetermined time corresponds to the sum of the first and second time periods.

* * * * *